United States Patent [19]

Clemens et al.

[11] Patent Number: 4,999,507

[45] Date of Patent: Mar. 12, 1991

[54] APPARATUS COMPRISING AN ELECTROSTATIC WAFER CASSETTE

[75] Inventors: James T. Clemens, Watchung; Shane Y. Hong, Berkeley Heights, both of N.J.

[73] Assignee: AT&T Bell Laboratories, Murray Hill, N.J.

[21] Appl. No.: 521,765

[22] Filed: May 10, 1990

[51] Int. Cl.$^5$ .............................................. H01J 37/20
[52] U.S. Cl. .............................. 250/492.2; 250/440.1; 250/453.1; 361/234
[58] Field of Search .................. 250/492.2, 492.3, 398, 250/492.21, 440.1, 453.1; 361/234

[56] References Cited

U.S. PATENT DOCUMENTS

| | | | |
|---|---|---|---|
| 4,412,133 | 10/1983 | Eckes et al. | 250/492.2 |
| 4,480,284 | 10/1984 | Tojo et al. | 361/234 |
| 4,502,094 | 2/1985 | Lewin et al. | 361/234 |

OTHER PUBLICATIONS

*Rev. Sci. Instrum.*, vol. 44, No. 10, Oct. 1973, "Electrostatic Wafer Chuck for Electron Beam Microfabrication," by George A. Wardly, pp. 1506-1509.

*Primary Examiner*—Jack I. Berman
*Attorney, Agent, or Firm*—M. I. Finston

[57] ABSTRACT

Disclosed is apparatus comprising an electrostatic cassette assembly for securing a semiconductor wafer during lithographic processing such as direct-write particle-beam lithography. The cassette assembly comprises a cassette body and an electrostatic chuck installable in, and removeable from, the cassette body. The electrostatic chuck comprises a charge plate having a thin dielectric layer on its upper surface, against which the wafer is flattened by Coulombic force. Charge storage means are included for maintaining an electrical potential difference between the wafer and the charge plate even in the absence of connection to a source of electrical energy external to the assembly.

10 Claims, 3 Drawing Sheets

APPARATUS COMPRISING AN ELECTROSTATIC WAFER CASSETTE

FIELD OF THE INVENTION

The invention relates to apparatus for supporting and securing target wafers for exposure to a particle beam or other actinic radiation in a lithographic system.

BACKGROUND OF THE INVENTION

The control of wafer flatness is essential in particle-beam, e.g., electron-beam, lithography. While undergoing lithographic processing, semiconductor wafers may be secured in chucks by mechanical clamps, gas pressure differences created by vacuum pumping, or electrostatic attraction. Because vacuum chucks are not useful in the evacuated environment of a particle-beam system, mechanical clamping is most widely used. However, mechanical clamps are unable to secure the central portion of the wafer, and bowing of the wafer in excess, for example, of 10 $\mu$m at the center of the wafer has been observed when the periphery of the wafer is held by mechanical clamps. This is undesirable because 10 $\mu$m exceeds the depth of focus of at least some particle-beam lithographic tools.

Electrostatic chucks, by contrast, are capable of securing the entire lower surface of the wafer by Coulombic force. As a consequence, the flatness of the wafer is improved relative to mechanical clamps. In a typical electrostatic chuck, the wafer effectively forms one plate of a parallel-plate capacitor. The other plate is formed by the upper surface of a conductive body, here called the charge plate. (By upper surface is meant the surface facing the approaching actinic radiation. By actinic radiation is here meant particle beams, e.g. electron beams, as well as electromagnetic radiation capable of causing chemical changes.) The upper surface of the charge plate is made extremely flat and is coated with a thin dielectric layer. The dielectric layer separates the charge plate from the wafer when the capacitor is assembled. Means are provided for applying a first potential, e.g., ground potential, to the wafer, and for applying a second potential different from the first to the charge plate. As a result, the capacitor is charged, and the wafer is electrostatically attracted to the charge plate and flattened against the dielectric layer.

It is advantageous to detachably mount the electrostatic chuck in a cassette, as described, for example, in U.S. Pat. No. 4,412,133, issued to W. A. Eckes, et al., on Oct. 25, 1983. The use of a cassette makes it possible to assemble the wafer onto the chuck outside of the lithographic system.

The cassette described by Eckes, et al., includes a parallelepipedal body thick enough to receive the charge plate and wafer within a central opening passing through the body. When the wafer and the charge plate beneath it are assembled in the opening, retaining means stop the vertical advancement of the wafer through the opening at a point such that the upper surface of the wafer is vertically aligned with a plane that coincides with the focal plane of the lithographic tool when the cassette is aligned within the lithographic system. Holding means press against the lower surface of the charge plate and keep the assembly intact. The cassette is loaded outside of the lithographic system by assembling the charge plate and wafer within the central opening. After the cassette is loaded, it is mounted within the lithographic system.

A potential advantage of cassettes for loading wafers into lithographic systems is the possibility of machine independence. That is, a variety of commercially available lithographic systems are offered by different manufacturers and in different models. In general, such machines either readily accept wafer cassettes, or are readily modified to accept wafer cassettes. Thus, in principle, a wafer together with a standardized electrostatic chuck could be assembled in any of a variety of different cassettes conforming to different machines, provided only that each cassette accepts the relevant standardized chuck size. In this sense, the chuck would be machine independent.

In practice, however, machine independence has not been achieved for electrostatic chucks. One obstacle to machine independence has been differing power supply requirements between different electrostatic chucks. That is, the various conventional electrostatic chucks that are available have different designs. Some designs require a dc power supply for charging, whereas other designs require an ac power supply for charging. Even designs sharing an ac or dc power requirement generally differ as to the voltage required. Thus, until now no truly machine independent electrostatic chuck has been provided, because any particular electrostatic chuck is likely to be electrically incompatible with all but one or a few models of lithographic system.

SUMMARY OF THE INVENTION

The invention involves an electrostatic chuck that incorporates means for storing electric charge. The charge storage means are capable of maintaining a charging potential on the electrostatic chuck for a long time relative to the time required for lithographic processing (typically 0.5–3 hours), whereby a wafer can remain secured to the chuck although the chuck is not conductively connected to any external source of electrical power. (By "wafer" is meant a wafer of semiconductor material, or a wafer-like body composed of non-magnetic, electrically conductive, e.g., metallic, material.) For example, a currently preferred embodiment is capable of maintaining an effective charging potential for several hundred hours. Representative charge storage means include batteries and capacitors. Because the inventive chuck includes charge storage means, it can be charged outside of the lithographic system and, as stated above, neither the chuck nor the cassette requires any electrical connection to a power supply while the chuck is in use, for example during lithographic processing. As a consequence, no electrical incompatibilities arise to defeat the potential machine independence of the chuck.

More particularly, the invention includes a cassette body having a central opening and a stop ring projecting partly into the opening, and an electrostatic chuck which includes a charge plate having a dielectric layer formed on its upper surface. The chuck is assembled in the cassette by first placing a wafer within the opening such that the upper surface of the wafer rests against the stop ring, and then placing the chuck within the opening such that the dielectric layer is pushed against the lower surface of the wafer. Means are provided for holding the upper surface of the wafer against the stop ring, and for holding the dielectric layer against the lower surface of the wafer. Charge storage means, e.g., capacitors or batteries, are incorporated in the chuck, and electrical connections of opposite polarities are provided from the charge storage means to, respectively, the wafer and the charge plate.

In a currently preferred embodiment, the chuck also includes a pushing disk mechanically coupled to the charge plate by three springs that extend from the upper surface of the pushing disk toward the lower surface of the charge plate. When they are in compression, the three springs provide the force that holds the wafer against the stop ring and the dielectric layer. After the wafer is placed against the stop ring and the dielectric layer is brought to rest against the chuck, the springs are compressed by pressing the lower surface of the pushing disk toward the stop ring. The springs are maintained in compression by, e.g., three retractable spring clips disposed around the central opening of the cassette and affixed to the lower surface of the cassette. The spring clips engage a shoulder formed in the periphery of the pushing disk such that after the pushing disk has advanced a predetermined vertical distance toward the stop ring, it is locked in position. In the same currently preferred embodiment, the charge storage means are capacitors mounted on the upper surface of the pushing disk.

Inter alia, the invention in at least one embodiment provides an electrostatic chuck that is adapted for charging at relatively low voltages, i.e., at voltages less than about 200 V. That is, most conventional electrostatic chucks require a charging voltage of several kilovolts. With regard to the inventive chuck, the voltage requirement is reduced by providing a relatively thin (i.e., about 25 $\mu$m thick) dielectric layer of relatively high (i.e., at least about 10) dielectric constant. This dielectric layer comprises aluminum oxide impregnated with fluorocarbon polymer. It is made by anodizing the surface of an aluminum charge plate, thereby forming, inter alia, hydrated alumina, and then chemically replacing at least some of the water of hydration with inert fluorocarbon polymer.

DETAILED DESCRIPTION OF A PREFERRED EMBODIMENT

Figure 1:
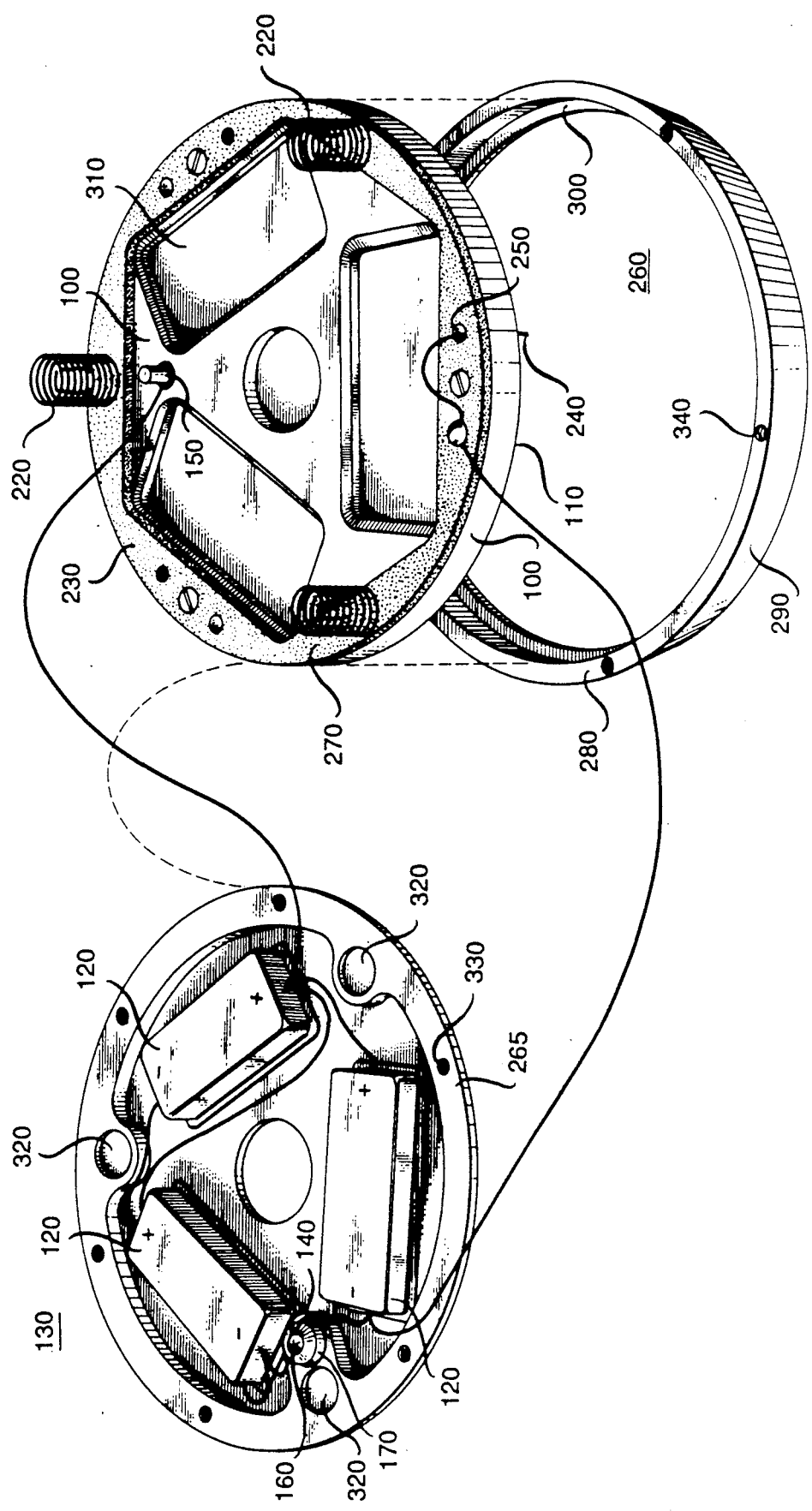
FIG. 1 is an exploded view of an electrostatic chuck made according to the invention.

With reference to FIG. 1, the charge plate 100 is a disk, exemplarily 3.948 inch (10.03 cm) in diameter and 0.300 inch (0.762 cm) thick. The thickness is chosen to provide enough rigidity to prevent significant flexing of the upper surface during normal handling, but also to be thin enough to fit conveniently in a wafer cassette. The charge plate is desirably made from high strength aluminum alloy 7075, which is non-magnetic, and provides good thermal conduction for dissipating heat generated by, e.g., a particle beam during direct writing. The charge plate is anodized to form, on the upper surface, a dielectric layer 110 that is 0.001 inch (0.025 mm) thick, and on all other surfaces, a dielectric layer (for insulation) 0.002 inch (0.051 mm) thick. All of the anodized surfaces are treated with polytetrafluoroethylene to form a synergistic coating on the aluminum. (The coating is "synergistic" because the combination enhances both the durability contributed by the anadization and the reduction of friction contributed by the polymer.) One suitable process for such polymer treatment is performed by the General Magnaplate Company of Linden, N.J., under the tradename TUFRAM. As noted, above, this process replaces at least some of the water of hydration of the oxidized aluminum by fluorocarbon. The combination of anodization and polymer coating provides a hard, self-lubricating surface that also has very favorable electrical properties. That is, the dielectric layer has a dielectric constant greater than about 10, and dielectric strength of about 500 V/mil (20 MV/m). Thus, the bulk portion of the charge plate is an excellent conductor of electricity, and the surface portion comprises an insulating layer. Because the coating is formed integrally with the underlying aluminum, it is not subject to peeling or layer separation.

Because the upper surface of the charge plate is used to assure the alignment of the wafer relative to the focal plane of the lithographic tool, that surface must be very flat. In order to make the surface as flat as possible, special precautions for preventing residual stress are desirably taken during the blank machining of the charge plate. Such precautions include: using a sharp tool, using a relatively low feed rate, using a small depth of cut, and using adequate coolant. After machining, the workpiece is cooled to cryogenic temperature to release internal stress before it is subjected to the first of two lapping steps. After lapping, the synergistic coating is applied to all surfaces except the upper surface. Because the workpiece is heated during the application of the coating, the upper surface is re-lapped to a flatness of 0.3 $\mu$m. The dielectric layer 110 is then formed. The overall flatness of the upper surface of the dielectric layer is within one $\mu$m. The anodization process for forming the dielectric layer is advantageously performed with special precautions to assure the formation of a uniform, stress-free coating. Such precautions include: anodizing in a uniform electric field; minimizing the generation of heat by very gradually increasing the applied voltage; and maintaining a fresh, clean, and well-agitated electrolyte.

To store electric charge, and thus to maintain the voltage applied to the charge plate, the chuck includes an array of capacitors 120, exemplarily three AT&T 705 G polyester capacitors, each of 3.83 $\mu$F capacitance. The capacitors are wired in parallel, such that the capacitances are additive, totalling in this example 11.49 $\mu$F. The capacitors are mounted on the upper surface (i.e, the surface that faces in the direction of the approaching actinic radiation, e.g., particle beam, during lithographic processing) of pushing disk 130. The capacitors are encapsulated within copper caps to prevent outgassing. One terminal of the capacitor array is grounded to the pushing disk via connection 140. The other terminal is connected to electrode 150. Electrode 150 is connected to charge plate 100. That is, a hole is formed in the lower surface of the charge plate, extending through the insulating anodized layer formed over that surface. Electrode 150 is a peg-like body, one end of which is soldered within the hole, making electrically conductive contact with the bulk portion of the charge plate. The other end of the electrode extends above the surface of the charge plate. Electrical connection is made between the capacitors and the electrode by extending an insulated wire from one of the capacitors to the electrode, and making a soldered joint between the wire and a copper lug, and between the lug and the electrode, close to the surface of the charge plate.

The capacitors are charged from a battery or dc power supply by applying a voltage between a ground point and the electrode. The electrode is accessible from the lower surface of the pushing disk via hole 160, here called the charging port. The charging port passes entirely through the pushing disk. Bushing 170 is fixed within port 160. The bushing has a central bore. The bushing extends partially into the port from the upper surface, such that the lower end of the bushing is recessed slightly below the lower surface of the pushing disk. A portion of the bushing extends above the upper surface such that the electrode is partially enclosed within the bushing when the pushing disk and charge plate are assembled together. The bushing is made from a vacuum-compatible polymeric material, such as that sold under the tradename VESPEL. The length of the electrode and the length of the bushing are so chosen that within the charging port, the lower end of the electrode cannot extend beyond the lower end of the bushing, and, in fact, always falls short of it even when the complete chuck is assembled and loaded into the cassette body. The bore in the bushing is, exemplarily, 0.12 inch (0.30 cm) in diameter. This offers sufficient access to the electrode by an electrical charging probe, but it is small enough to prevent a human operator from accidentally making finger contact with the electrode.

Figure 2:
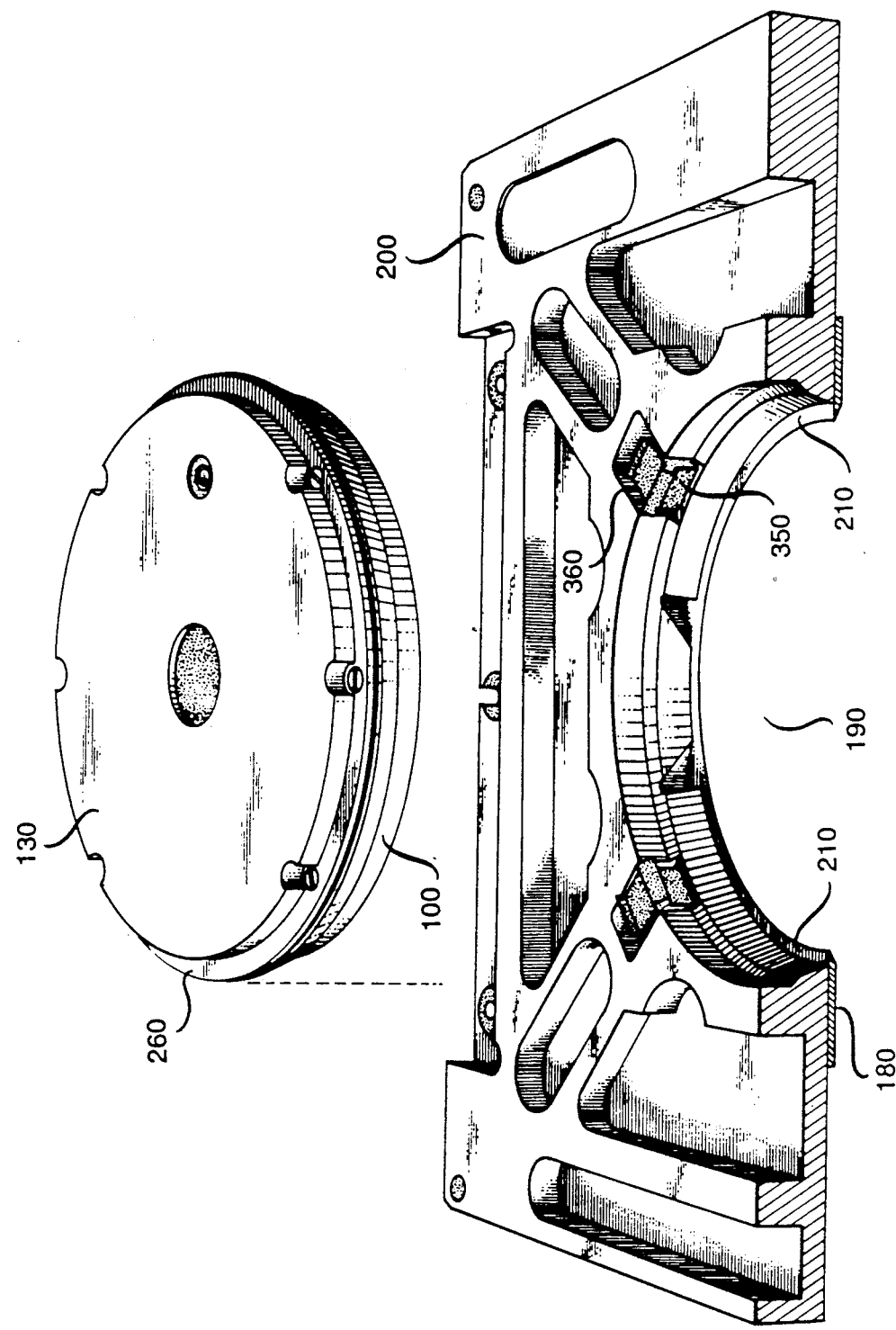
FIG. 2 is a perspective view of the assembled chuck of FIG. 1 and a cassette body made according to the invention.

Generally, when a wafer is mounted in a cassette, its upper surface is registered to a reference plane which, after assembly in the lithographic system, bears a known relationship with the focal plane of the lithographic tool. With reference to FIG. 2, this is achieved in the inventive cassette by providing stop ring 180, which is mounted on the upper surface of the cassette. The stop ring is an annulus, mounted concentrically with circular opening 190 in cassette body 200. The inner diameter of the stop ring is smaller than the diameter of opening 190, and therefore the inner portion of the stop ring projects into opening 190, providing reference tongue edge 210, which partially blocks the upper end of the opening. When a wafer is placed in the opening, the upper surface of the wafer comes to rest against reference tongue edge 210. The lower surface of the stop ring is ground very flat, and is mounted directly on the upper surface of the cassette body 200. Thus, the lower surface of the stop ring is in contact with the upper surface of the cassette body. The lower surface of the stop ring thus provides the reference plane for the wafer. When the wafer is flattened and pressed up against edge 210, the upper surface of the wafer is, for practical purposes, coplanar with the upper surface of the cassette body.

Referring back to FIG. 1, the wafer is pressed against the stop ring with a force of about 3 lbs (13 Nt), provided by three springs 220. A force of about 3 lbs (13 Nt) is preferable because that force is adequate not only to hold the wafer against the stop ring, but also to prevent slippage during side acceleration resulting from ordinary handling.

Springs 220 are attached to insulating shoulder 230, exemplarily by gluing the end of each spring in a shallow recess formed in the lower surface of the shoulder. The shoulder is made of an insulating material, for example the vacuum-compatible polymeric material sold under the tradename VESPEL. The shoulder is attached to the lower surface of charge plate 100 by, e.g., the use of screws.

In use, the wafer is first mechanically registered against reference tongue edge 210 by compressing springs 220 and locking them in compression. The wafer is then electrostatically flattened against dielectric surface 110 on charge plate 100. It should be noted in this regard that dielectric flattening alone, without mechanical registry, typically is not adequate. That is, the back surface of the wafer, i.e., the surface that is flattened against the charge plate, generally is not useful as a reference plane because the thickness of the wafer is not uniform. For example, the thickness of a 4 inch (10.2 cm) diameter wafer typically varies from about 0.0197 inch (0.5004 mm) to about 0.0216 inch (0.5486 mm), resulting in positive and negative variations of about 24 $\mu$m.

The stop ring serves not only to provide a reference surface, but also to ground the wafer. That is, the stop ring is preferably made from molybdenum, which not only is non-magnetic and is a good conductor of electricity, but also has a relatively low coefficient of friction and relatively high rigidity. Referring again to FIG. 2, when the wafer is pressed against tongue edge 210, the upper surface of the wafer (provided it is not coated with an insulating layer) is in electrical contact with the stop ring, and through the stop ring, it is in electrical contact with cassette body 200, which, in turn, is electrically grounded by physical contact with the grounded stage of the lithographic system. The stop ring serves not only as a ground contact, but also as an electrostatic shield surrounding the wafer to prevent field leakage. Such electrostatic shielding is especially useful when the actinic radiation comprises an electron beam, because the low mass of electrons makes them especially sensitive to stray electrostatic fields.

Means are also provided for grounding the lower surface of the wafer. This is especially significant when the upper surface of the wafer is coated with a layer of non-conductive photoresist, which can interfere with electrical contact between the wafer and the stop ring. Turning again to FIG. 1, the lower-surface ground contact is provided by pin 240, which projects entirely through the insulating shoulder and the charge plate via grounding port 250. Pin 240 should be made of an electrically conductive, non-magnetic material, and is preferably made of tungsten or molybdenum. The end of the pin that touches the wafer should be sharpened, in order to penetrate any oxide (e.g., silicon dioxide) surface layer that may be present if the surface of the wafer has been permitted to oxidize. The opposite end of pin 240 is anchored to insulating shoulder 230. The ground connection to the pin is made by electrically connecting a wire from the anchored end of the pin to the ground terminal of the array of capacitors 120.

The complete chuck assembly consists of charge plate 100, insulating shoulder 230, pushing disk 130, and rim 260. Like the charge plate, the pushing disk and rim are desirably made from aluminum alloy 7075.

The upper portion of pushing disk 130 has a larger diameter than the lower portion, resulting in a shoulder region 265 extending beyond the lower portion of the pushing disk.

As noted, above, insulating shoulder 230 is mounted on the lower surface of the charge plate. The shoulder is annular in shape. It is mounted concentrically with the charge plate. The shoulder has an outer diameter that exceeds the diameter of the charge plate by a small amount. As a consequence, the outer portion of the shoulder extends beyond the lower surface of the charge plate, forming lip 270. Although the outer periphery of the shoulder is circular in shape, the inner periphery is not necessarily circular. For example, it is advantageously made hexagonal in shape, in order to provide room for capacitors 120 and electrode 150.

Rim 260 is an annular ring having a lower surface 280, a side portion 290, and an upper step-like portion 300. Side portion 290 is tapered, such that the outer and inner diameters of the side portion decrease from the bottom toward the top. The taper of the side portion ends abruptly where the side portion meets step-like portion 300, which extends radially inward a distance approximately equal to the radial extent of lip 270. The minimum inside diameter of side portion 290 is slightly larger than the diameter of shoulder 230, such that when the assembly of charge plate and shoulder is inserted within the rim, lip 270 rests against step-like portion 300, and lateral motion of the assembly is substantially prevented by side portion 290. The maximum outer diameter of the rim is equal to the maximum diameter of the pushing disk (i.e., the diameter of shoulder region 265).

The chuck is assembled by inverting the charge plate and rim, and placing the charge plate, wafer-side down, in the rim. The pushing disk is then also inverted and placed over the charge plate. Advantageously, cavities 310 are formed in the lower surface of the charge plate to partially receive the capacitors when the pushing disk is placed over the charge plate, thus making it possible to reduce the vertical height of the chuck. Also advantageously, cavities 320 are formed in the upper surface of the pushing disk to receive the upper ends of springs 220 during the same assembly step, in order to prevent lateral slipping of the springs. After the pushing disk is placed over the charge plate, the pushing disk is pressed toward the charge plate, compressing the springs. The assembly is completed by fastening the pushing disk to the rim by means of screws that pass through holes 330 in shoulder region 265 of the pushing disk and tighten within threaded holes 340 in lower surface 280 of the rim.

Figure 3:
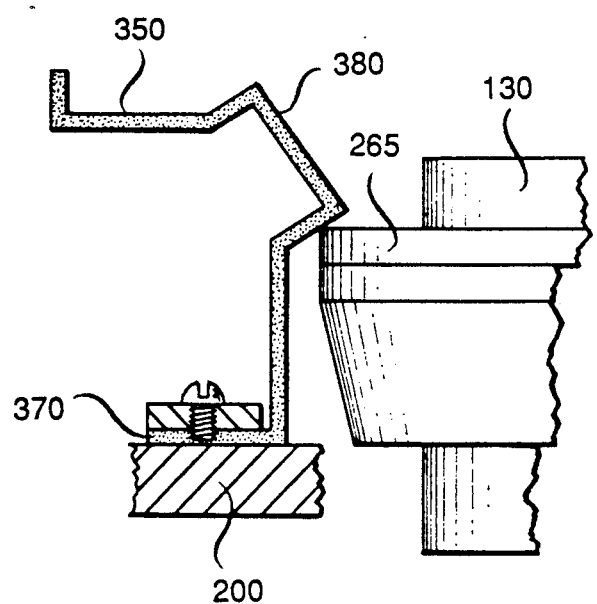
FIG. 3 is a cross sectional view of a spring clip mounted on the cassette body of FIG. 2 and a portion of the chuck of FIG. 2, illustrating a method of holding the chuck in position within the cassette body.

With reference to FIGS. 2 and 3, means are affixed to the lower surface of cassette body 200 for holding the chuck in position within central opening 190, such that springs 220 are locked in a compressed state. The holding means advantageously consist of three spring clips 350 made of a suitable non-magnetic material, exemplarily bronze. Each of the spring clips is positioned within a recess 360 in the lower surface of the cassette body, and is attached to the cassette body by a screw passing through foot portion 370 of the spring clip. Each of the spring clips has a holding portion 380 that engages shoulder region 265 of pushing disk 130.

A preferred method of loading the cassette is now described with reference to FIGS. 1 and 3. The cassette body is first placed, in an inverted orientation, on a supporting surface. The wafer is placed within central opening 190 such that the upper surface of the wafer rests against the stop ring. The wafer is then rotated about a vertical axis to bring it into proper orientation. The previously assembled chuck is then placed within the central opening, such that dielectric layer 110 rests against the lower surface of the wafer. Spring clips 350 are then retracted and the pushing disk is pressed toward the charge plate, further compressing the springs, until shoulder region 265 of the pushing disk passes holding portions 380 of spring clips 350, and the holding portions snap behind shoulder region 265, locking it in position.

A preferred method of charging the electrostatic chuck involves the use of batteries, e.g., two 93 V dry cells connected in series, to provide a total voltage of about 186 V. One lead from the batteries is brought into contact with electrode 150 through charging port 160. The other lead is the ground lead. It is brought into contact with the cassette body. The contact needs to be maintained for a few, typically 1–5, seconds. The leads are then removed. As a consequence of this charging step, the wafer is flattened against dielectric layer 110.

If it is desired to remove the wafer from the cassette, e.g., after lithographic processing, it is desirable first to discharge the electrostatic chuck. That is, after the cassette is removed from the lithographic system, the chuck is discharged via a high-resistance wire. One end of the wire is brought into contact with the cassette body, and then the other end is brought into contact with the electrode for a few seconds (i.e., several times the product of the resistance of the wire and the total capacitance of capacitors 120). The spring clips are then pushed back and the chuck is withdrawn from the cassette body. The wafer is then removed from the cassette body.

EXAMPLE

The flatness of a silicon wafer on an electrostatic chuck was observed by laser interferometry. An electrostatic chuck made according to the invention was electrically connected to a high voltage dc power supply (Model 405B, manufactured by the Fluke Company). The electrode of the charge plate was charged positive relative to the wafer. The upper surface of the wafer was illuminated by one arm of a split beam of light from a helium-neon laser. Laser light reflected from the surface of the wafer was combined with light in the other arm of the split laser beam and recorded by a camera. The pattern of interference fringes was observed as the applied voltage was varied. A initial change in the interference fringe pattern was observed at an applied voltage of 50 V. The wafer almost attained its maximum flatness at 100 V, and no further flattening was observed at voltages exceeding 150 V. Voltage breakdown of the dielectric layer was observed at 340 V.

In a second test, an electrostatic chuck, made according to the invention, was provided with a parallel array of three AT and T 705G polyester capacitors, each having a capacitance value of 4.64 $\mu$F. The capacitors were initially charged to 96 V, and the rate of discharge as a result of current leakage was observed. The voltage was observed to decay from the initial value of 96 V to 78 V in 13 hours.

In a third test, a representative group of wafers of similar dimensions were individually loaded into a cassette, including an electrostatic chuck, made according to the invention. The chuck was charged to 186 V from a pair of 93 V dry cells connected in series, and the flatness of the wafers was measured by laser interferometry. Before charging, the fringes displayed by the wafers were too numerous to count. After charging, the number of fringes was reduced to about 10 or less, signifying a flatness (i.e., a maximum vertical deviation) of the upper wafer surface of no more than about 3 $\mu$m.

In a fourth test, a wafer was assembled in the cassette and the cassette was charged to 186 V, as described above. Immediately after charging, the flatness of the wafer was determined to be within 3 μm by laser interferometry. Without any recharging, the cassette maintained the flatness of the wafer within 3 μm for more than 500 hours. Throughout the 500-hour duration of the test, the cassette was exposed to ambient office air. The cassette was also repeatedly carried around during this time period.

We claim:

1. Apparatus comprising an electrostatic cassette assembly comprising:
    (a) a casette body adapted for receiving therein a wafer-like body having upper and lower surfaces such that the lower surface of the body is supported by support means, the support means to be referred to as a "charge plate;" the charge plate comprising an electrically conductive member and a dielectric layer on the conductive member such that the body is not in electrically contact with the member; and
    (b) means for producing an electrical potential difference between the member and the body;
    the apparatus further comprising means for causing a processing layer on the semiconductor body to be exposed to actinic radiation;
    characterized in that
    (c) the assembly comprises means for storing an electrical charge, said charge storage means adapted for maintaining the electrical potential difference, without connection to a source of electrical energy external to the assembly, for a period of time that is longer than an average exposure time associated with the apparatus.

2. Apparatus of claim 1, wherein:
    the cassette body has an upper surface, at least a portion of which is planar; and
    a central opening is defined in the cassette body, extending through the planar portion, for receiving therein the semiconductor body;
    the apparatus further comprising an electrically conductive metallic ring mounted on the upper surface of the cassette body coaxially with the central opening, the inner diameter of the ring being smaller than the diameter of the central opening, such that the ring extends partially into the central opening and when the semiconductor body is received within the central opening, the upper surface of the semiconductor body rests against the ring.

3. Apparatus of claim 2, further comprising compressive means for simultaneously applying pressure between the lower surface of the semiconductor body and the charge plate, and between the upper surface of the semiconductor body and the ring, such that when the compressive means are activated and the electrical potential difference is produced, the semiconductor body is electrostatically flattened such that it becomes essentially coplanar with the planar portion of the upper surface of the cassette body.

4. Apparatus of claim 3, wherein the compressive means comprise:
    a disk having upper and lower surfaces;
    at least three springs extending between the upper surface of the disk and the charge plate, such that force exerted on the lower surface of the disk is transmitted via the springs to the charge plate; and
    means for temporarily securing the disk in a fixed position relative to the cassette body such that when the securing means are activated, the springs are held in compression.

5. Apparatus of claim 4, wherein the securing means comprise at least three retractable spring clips that engage a portion of the lower surface of the disk.

6. Apparatus of claim 1, wherein the charge storage means comprise at least one capacitor.

7. Apparatus of claim 1, wherein the charge storage means comprise at least one electrical battery.

8. Apparatus of claim 4, wherein the charge storage means are included between the charge plate and the disk.

9. Apparatus of claim 1, wherein the charge storage means are adapted to maintain a potential difference less than about 200 V between the semiconductor body and the charge plate.

10. Apparatus of claim 4, wherein the disk is electrically conductive, and the apparatus further comprises an electrically conductive pin electrically connected to the disk and making contact with the lower surface of the semiconductor body via a hole passing through the charge plate, such that the disk is electrically connected to the semiconductor body.

* * * * *

UNITED STATES PATENT AND TRADEMARK OFFICE
CERTIFICATE OF CORRECTION

PATENT NO. : 4,999,507

DATED : March 12, 1991

INVENTOR(S) : James T. Clemens and Shane Y. Hong

It is certified that error appears in the above-identified patent and that said Letters Patent is hereby corrected as shown below:

Column 9, line 19 after "electrically" insert --conductive--

Signed and Sealed this

Twenty-fifth Day of August, 1992

Attest:

DOUGLAS B. COMER

*Attesting Officer*      *Acting Commissioner of Patents and Trademarks*